United States Patent
Hahm et al.

(10) Patent No.: US 9,198,149 B2
(45) Date of Patent: Nov. 24, 2015

(54) TWO-STEP SEARCHER FOR CELL DISCOVERY

(75) Inventors: Mark Hahm, Hartland, CA (US); Severine Catreux, Cardiff, CA (US); Nelson Sollenberger, St. Thomas, PA (US)

(73) Assignee: Broadcom Corporation, Irvine, CA (US)

( * ) Notice: Subject to any disclaimer, the term of this patent is extended or adjusted under 35 U.S.C. 154(b) by 599 days.

(21) Appl. No.: 13/432,320

(22) Filed: Mar. 28, 2012

(65) Prior Publication Data

US 2013/0143554 A1    Jun. 6, 2013

Related U.S. Application Data

(60) Provisional application No. 61/565,864, filed on Dec. 1, 2011, provisional application No. 61/568,868, filed on Dec. 9, 2011.

(51) Int. Cl.
| | |
|---|---|
| *H04W 56/00* | (2009.01) |
| *H04W 36/18* | (2009.01) |
| *H03M 13/37* | (2006.01) |
| *H03M 13/39* | (2006.01) |
| *H04L 1/00* | (2006.01) |

(52) U.S. Cl.
CPC ........ *H04W 56/002* (2013.01); *H03M 13/3723* (2013.01); *H03M 13/3905* (2013.01); *H03M 13/3972* (2013.01); *H04L 1/005* (2013.01); *H04W 36/18* (2013.01)

(58) Field of Classification Search
None
See application file for complete search history.

(56) References Cited

U.S. PATENT DOCUMENTS

| | | | |
|---|---|---|---|
| 5,627,592 A * | 5/1997 | Tichelaar et al. | 348/429.1 |
| 6,643,318 B1 | 11/2003 | Parsa et al. | |
| 6,768,768 B2 * | 7/2004 | Rao et al. | 375/142 |
| 7,042,930 B2 * | 5/2006 | Dafesh | 375/149 |
| 7,292,548 B2 * | 11/2007 | Lim et al. | 370/328 |
| 7,957,758 B2 | 6/2011 | Soerensen et al. | |
| 8,179,946 B2 | 5/2012 | Roberts et al. | |
| 8,320,318 B2 | 11/2012 | Baker et al. | |
| 8,670,509 B2 | 3/2014 | Sollenberger et al. | |
| 2001/0040916 A1 | 11/2001 | Sato | |
| 2003/0039228 A1 * | 2/2003 | Shiu et al. | 370/331 |
| 2003/0095516 A1 * | 5/2003 | Ok et al. | 370/331 |
| 2004/0062298 A1 * | 4/2004 | McDonough et al. | 375/150 |
| 2004/0062299 A1 * | 4/2004 | McDonough et al. | 375/150 |
| 2004/0081115 A1 | 4/2004 | Parsa et al. | |
| 2004/0199858 A1 | 10/2004 | Becker et al. | |

(Continued)

OTHER PUBLICATIONS

Dielissen, et al., "State Vector Reduction for Initailization of Sliding Windows Map," Proc 2nd International Symposium on Turbo Codes & Related Topics, Sep. 2000, pp. 387-390.

*Primary Examiner* — Ian N Moore
*Assistant Examiner* — Latresa McCallum
(74) *Attorney, Agent, or Firm* — McDermott Will & Emery LLP

(57) ABSTRACT

Disclosed are various embodiments involving a two-step searcher for cell discovery. Multiple scrambling codes associated with multiple neighboring cells are obtained. Slot timing is obtained for a received signal based at least in part on a detection of primary synchronization peak energy in the received signal. One of the scrambling codes for decoding the received signal is identified based at least in part on testing multiple scrambling code hypotheses in parallel during an accumulation time period of the received signal in response to obtaining the slot timing.

20 Claims, 7 Drawing Sheets

(56) References Cited

U.S. PATENT DOCUMENTS

| | | |
|---|---|---|
| 2004/0264497 A1 | 12/2004 | Wang et al. |
| 2005/0113087 A1 | 5/2005 | Rick et al. |
| 2007/0165567 A1 | 7/2007 | Tan et al. |
| 2007/0243848 A1 | 10/2007 | Behzad |
| 2008/0298325 A1 | 12/2008 | Vujcic |
| 2009/0175205 A1 | 7/2009 | Mathew et al. |
| 2009/0207746 A1 | 8/2009 | Yuan et al. |
| 2009/0225918 A1 | 9/2009 | Telukuntla et al. |
| 2009/0252125 A1 | 10/2009 | Vujcic |
| 2011/0064122 A1 | 3/2011 | Hahm et al. |
| 2011/0098003 A1* | 4/2011 | Hahm et al. ........ 455/63.1 |
| 2012/0134293 A1 | 5/2012 | Nistor et al. |
| 2013/0141257 A1 | 6/2013 | Chiu et al. |
| 2013/0142057 A1 | 6/2013 | Molev-Shteiman |
| 2013/0142061 A1 | 6/2013 | Kuo et al. |
| 2013/0142223 A1 | 6/2013 | Kuo |
| 2013/0143577 A1 | 6/2013 | Chiu et al. |
| 2013/0143605 A1 | 6/2013 | Chiu et al. |
| 2013/0301581 A1 | 11/2013 | Johansson et al. |
| 2013/0322386 A1 | 12/2013 | Zhang et al. |

* cited by examiner

ND PROCESSING," having Ser. No. 61/565,864, filed on Dec. 1, 2011, and U.S. Provisional Patent Application entitled "CELLULAR BASEBAND PROCESSING," having Ser. No. 61/568,868, filed on Dec. 9, 2011, both of which are incorporated by reference in their entirety.

TWO-STEP SEARCHER FOR CELL DISCOVERY

CROSS-REFERENCE TO RELATED APPLICATIONS

This application claims priority to, and the benefit of, U.S. Provisional Patent Application entitled "CELLULAR BASEBAND PROCESSING," having Ser. No. 61/565,864, filed on Dec. 1, 2011, and U.S. Provisional Patent Application entitled "CELLULAR BASEBAND PROCESSING," having Ser. No. 61/568,868, filed on Dec. 9, 2011, both of which are incorporated by reference in their entirety.

BACKGROUND

Wideband code division multiple access (WCDMA) is a third generation (3G) cellular technology that enables the concurrent transmission of a plurality of distinct digital signals via a common RF channel. WCDMA supports a range of communications services that include voice, high speed data and video communications. One such high speed data communications service, which is based on WCDMA technology, is the high speed downlink packet access (HSDPA) service.

WCDMA is a spread spectrum technology in which each digital signal is coded or "spread" across the RF channel bandwidth using a spreading code. Each of the bits in the coded digital signal is referred to as a "chip." A given base transceiver station (BTS), which concurrently transmits a plurality of distinct digital signals, may encode each of a plurality of distinct digital signals by utilizing a different spreading code for each distinct digital signal. At a typical BTS, each of these spreading codes is referred to as a Walsh code. The Walsh coded digital signal may in turn be scrambled by utilizing a pseudo-noise (PN) bit sequence to generate chips. An example of a PN bit sequence is a Gold code. Each of a plurality of BTS within an RF coverage area may utilize a distinct PN bit sequence. Consequently, Walsh codes may be utilized to distinguish distinct digital signals concurrently transmitted from a given BTS via a common RF channel while PN bit sequences may be utilized to distinguish digital signals transmitted by distinct BTSs. The utilization of Walsh codes and PN sequences may increase RF frequency spectrum utilization by allowing a larger number of wireless communications to occur concurrently within a given RF frequency spectrum. Accordingly, a greater number of users may utilize mobile communication devices, such as mobile telephones, Smart phones and/or wireless computing devices, to communicate concurrently via wireless communication networks.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure. Moreover, in the drawings, like reference numerals designate corresponding parts throughout the several views.

DETAILED DESCRIPTION

Figure 1:
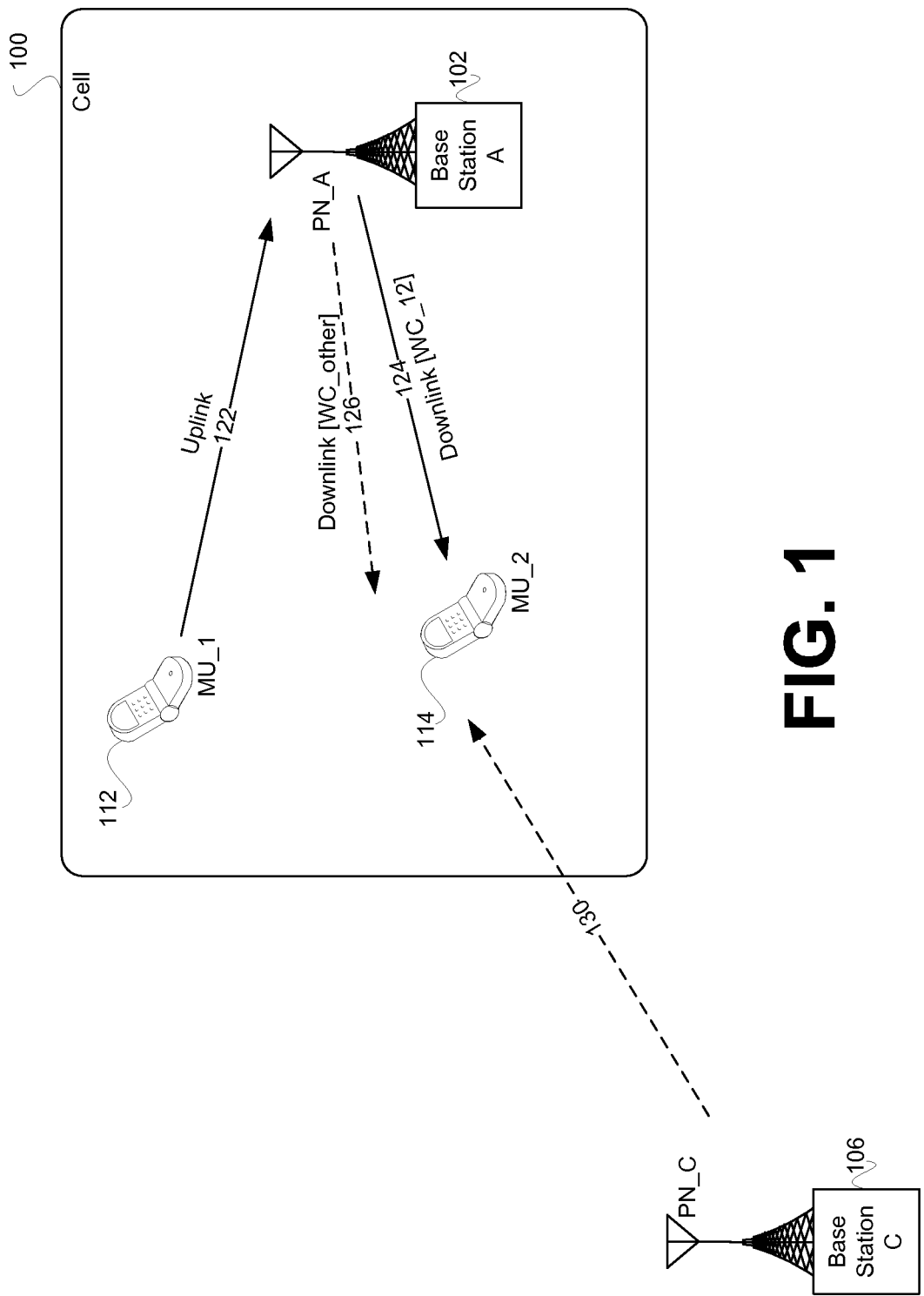
FIG. 1 is a drawing of an exemplary wireless communication system, in accordance with an embodiment of the present disclosure.

The present disclosure relates to an enhanced two-step searcher for cell discovery. In WCDMA and/or other wireless technologies, it may be necessary for a wireless communications device, such as a cell phone, to periodically determine the identity of active cells from a monitored set. Once cells are identified, the received energy of the cells may be measured for reporting back to the network. This enables dynamic cell reselection and soft handover. The cells that are to be measured may be divided, for example, into three sets: active, monitored, and detected. Each set may have its own requirements on how to perform measurements in the cell. The enhanced two-step searcher discovers the identity of cells from the monitored set. The monitored set includes cells that have been identified as possible candidates for handover but have not yet been added to the active set.

The enhanced two-step searcher performs the second step of a two-step search. When a wireless communications device becomes active periodically according to a discontinuous reception (DRX) cycle, the wireless communications device may engage in a two-step search. In the two-step search, the wireless communications device processes the received signal to determine frame and slot timing of a scrambling code belonging to one of the cells in the monitored set. During the first step of the cell search procedure, the wireless communications device uses the primary synchronization (PSYNC) code sequence to acquire slot synchronization for a cell. This is typically performed with a single matched filter, or any similar device, matched to the primary synchronization code that is common to all cells. The slot timing of the cell can be obtained, for example, by detecting peaks in the matched filter output.

In the second step, the wireless communications device uses the enhanced two-step searcher to identify the scrambling code and the frame timing for the signal for which the slot timing was found by testing various scrambling code candidates (available from the list of scrambling codes in the monitored set) and frame timing hypotheses. In a two-step search, the list of possible scrambling codes for neighboring cells is obtained in advance, for example, over the network. In WCDMA, there are 15 slots per 10 millisecond frame, and frame timing refers to the frame boundary where slot index 0 begins. It may be the case that only primary scrambling codes, and not secondary scrambling codes, are searched.

The two-step search logic may be active regardless of whether the wireless communications device is in idle mode or in connected (DCH) state. The two-step search logic may become active periodically according to a discontinuous reception (DRX) cycle. A DRX cycle is defined by an awake time and a sleep time. It is desirable to minimize the time used for cell discovery during the awake time of the DRX cycle.

For example, being able to discover cells on a faster basis will translate into significant power savings since the wireless communications device may go back to sleep, and thus turn off its radio-frequency (RF) and baseband components. Various embodiments of the present disclosure are configured to search many scrambling codes within a slot time period. By searching many scrambling codes within a slot time period, power in RF and baseband components is conserved.

FIG. 1 is a drawing of an exemplary wireless communication system, in accordance with an embodiment of the present disclosure. Referring to FIG. 1, there is shown a cell 100 and a base station C 106. The cell 100 comprises base station A 102, mobile communication device MU_1 112 and mobile communication device MU_2 114. The base station 106 may be located outside of the cell 100.

The mobile communication devices MU_1 112 and MU_2 114 may be engaged in a communication via the base station A 102. The mobile communication device MU_1 112 may transmit signals to the base station A 102 via an uplink RF channel 122. In response, the base station A 102 may transmit signals to the mobile communication device MU_2 114 via a downlink RF channel 124. Signals transmitted by the base station A 102 may communicate chips that are generated utilizing a scrambling code PN_A. The signals transmitted via RF channel 124 may be spread utilizing a spreading code WC_12. The spreading code WC_12 may comprise an orthogonal variable spreading factor (OVSF) code, for example, a Walsh code, which enables the mobile communication device MU_2 114 to distinguish signals transmitted by the base station A 102 via the downlink RF channel 124 from signals transmitted concurrently by the base station A 102 via other downlink RF channels, for example downlink RF channel 126.

The base station A 102 may utilize one or more OVSF codes, WC_other, when spreading data transmitted via downlink RF channel 126. The one or more OVSF codes, WC_other, may be distinct from the OVSF code WC_12. The base station A 102 may also transmit broadcast signals which may be received by all mobile communication devices. The broadcast signals, spread by OVSF code, WC_broadcast, may be sent simultaneously on downlink RF channels 124 and 126.

The mobile communication device MU_2 114 may receive multiple access interference (MAI) signals from RF channel 126 and/or RF channel 130. As stated above, the signals received via RF channel 126 may be transmitted by the base station A 102. The signals received via RF channel 130 may be transmitted by the base station C 106. The signals transmitted by the base station C 106 may be scrambled based on a scrambling code PN_C.

The mobile communication device MU_2 114 may be operable to perform a soft handoff from the current serving base station A 102 to a base station, which is outside of the cell 100, for example, the base station C 106. Accordingly, the mobile communication device MU_2 114 may be operable to process received signals based on scrambling code PN_C. In this regard, MU_2 114 may listen for signals from base station C 106.

Although FIG. 1 depicts communication between two mobile devices via a single BTS, the present disclosure is not so limited. For example, aspects of the present disclosure may be equally applicable regardless of the origin of data communicated wirelessly to the mobile communication device 114.

Figure 2:
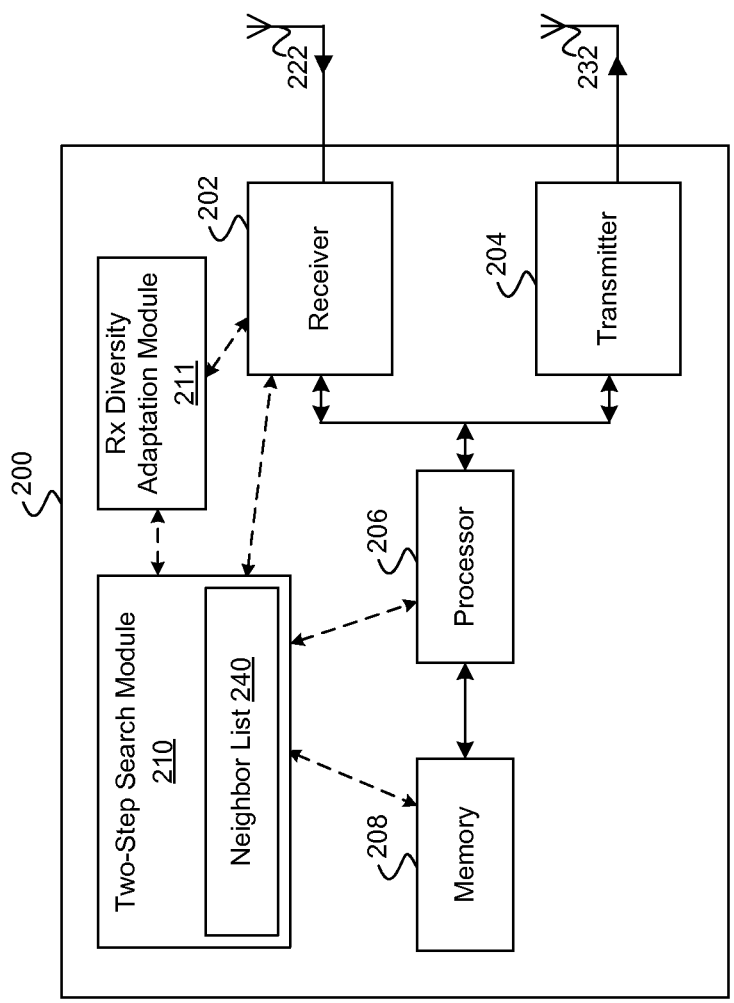
FIG. 2 is a drawing of an exemplary wireless communications device, in accordance with an embodiment of the present disclosure.

FIG. 2 is a drawing of an exemplary wireless communications device 200, in accordance with an embodiment of the present disclosure. Referring to FIG. 2, there is shown a wireless communications device 200, a receiving antenna 222 and a transmitting antenna 232. The wireless communications device 200 may comprise at least a receiver 202, a transmitter 204, a processor 206, a memory 208, a two-step search module 210, a receive diversity adaptation module 211, and/or other components. Although a separate receiver 202 and transmitter 204 are illustrated by FIG. 2, the present disclosure is not limited. In this regard, the transmit function and receive function may be integrated into a single transceiver block. The wireless communications device 200 may also comprise a plurality of transmitting antennas and/or a plurality of receiving antennas, for example to support diversity transmission and/or diversity reception. Various embodiments may comprise a single antenna, which is coupled to the transmitter 204 and receiver 202 via a transmit and receive (T/R) switch. The T/R switch may selectively couple the single antenna to the receiver 202 or to the transmitter 204 under the control of the processor 206, for example.

The receiver 202 may comprise suitable logic, circuitry, interfaces and/or code that may be operable to perform receive functions that may comprise PHY layer function for the reception or signals. These PHY layer functions may comprise, but are not limited to, the amplification of received RF signals, generation of frequency carrier signals corresponding to selected RF channels, for example uplink or downlink channels, the down-conversion of the amplified RF signals by the generated frequency carrier signals, demodulation of data contained in data symbols based on application of a selected demodulation type, and detection of data contained in the demodulated signals. The RF signals may be received via the receiving antenna 222. The receiver 202 may be operable to process the received RF signals to generate baseband signals. A chip-level baseband signal may comprise a plurality of chips. The chip-level baseband signal may be descrambled based on a PN sequence and despread based on an OVSF code, for example a Walsh code, to generate a symbol-level baseband signal. The symbol-level baseband signal may comprise a plurality of data symbols. The receiver 202 may comprise a rake receiver, which in turn comprises a plurality of rake fingers to process a corresponding plurality of received multipath signals.

The transmitter 204 may comprise suitable logic, circuitry, interfaces and/or code that may be operable to perform transmit functions that may comprise PHY layer function for the transmission or signals. These PHY layer functions may comprise, but are not limited to, modulation of received data to generate data symbols based on application of a selected modulation type, generation of frequency carrier signals corresponding to selected RF channels, for example uplink or downlink channels, the up-conversion of the data symbols by the generated frequency carrier signals, and the generation and amplification of RF signals. The RF signals may be transmitted via the transmitting antenna 232.

The memory 208 may comprise suitable logic, circuitry, interfaces and/or code that may enable storage and/or retrieval of data and/or code. The memory 208 is defined herein as potentially including both volatile and nonvolatile memory and data storage components. Volatile components are those that do not retain data values upon loss of power. Nonvolatile components are those that retain data upon a loss of power. Thus, the memory 208 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

The two-step search module 210 may comprise suitable logic, circuitry and/or code that are operable to identify, given a slot timing, the frame timing of a corresponding scrambling code employed in a received signal. Some features of the two-step search module 210 may include parallel search for multiple scrambling codes (e.g., 32 scrambling codes, or some other number of scrambling codes), receive combining diversity support, resource sharing, dual carrier support, scalable power consumption due to scalable search parameters such that the number of scrambling codes to search in parallel, receive and/or transmit diversity, and/or other features. The two-step search module 210 has access to a neighbor list 240 including a list of scrambling codes employed by neighboring cells belonging to the monitored set. In one embodiment, the neighbor list 240 may include up to 32 different scrambling codes. Such codes may be selected from 512 possible primary scrambling codes (SC) defined by scrambling code group j and primary scrambling code k, where the primary scrambling code ID is given by:

Primary SC ID=$8*j+k$, where $J=0, \ldots, 63$ and $k=0, \ldots, 7$

In operation, the receiver 202 may receive signals via the receiving antenna 222. In an exemplary embodiment, the receiver 202 may comprise a rake receiver. The receiver 202 may communicate signals to the processor 206 and/or to the two-step search module 210.

The receiver 202 may generate timing information that corresponds to each of the fingers in the rake receiver portion of the receiver 202. Each of the fingers in the rake receiver may process a distinct one of a plurality of multipath signals that are received within a delay spread time duration. Based on the received RF signals, the receiver 202 may generate chip-level baseband signals. The rake receiver within the receiver 202 may generate one or more symbol-level baseband signals based on a selected one or more OVSF codes and a selected one or more PN sequences. The symbol-level baseband signals may be communicated to the processor 206. The OVSF codes may be selected based on a specified desired user signal. For example, referring to FIG. 1, the rake receiver within the receiver 202 associated with mobile communication device MU_2 may select an OVSF code, WC_12, or a broadcast OVSF code, WC_broadcast, and a PN sequence, PN_A, which may be utilized to generate the symbol-level baseband signal from the chip-level baseband signal.

The processor 206 may determine which BTSs are associated with a current cell 100 and which BTSs are not associated with the current cell 100. For example, the processor 206 may determine that the base station A 102 is associated with the current cell 100, while the base station C 106 is not associated with the current cell 100. In an exemplary embodiment, the processor 206 may store PN sequences for at least a portion of the BTSs that are associated with the current cell 100. For example, referring to FIG. 1, the processor 206 may generate and/or store corresponding PN sequences, for example PN_A in the memory 208. The PN sequences may be generated on the fly based on the code structure utilized by the BTS and/or based on timing information associated with the BTS. The PN sequence PN_A may be associated with the current cell 100. The processor 206 may correspond to an ARM processor or other processor.

In other exemplary embodiments, the processor 206 may generate and/or store PN sequences for at least a portion of the BTSs that are associated with the current cell 100 and at least a portion of the BTSs that are not associated with the current cell 100. For example, referring to FIG. 1, the processor 206 may generate and/or store corresponding PN sequences, for example PN_A and PN_C in the memory 208. In general, the processor 206 may store the PN sequences for the BTSs from which a mobile communication device, for example the mobile communication device MC_2 114, may expect to receive signals and the processor 206 may store PN sequences from which the mobile communicating device may not expect to receive signals. The mobile communication device may expect to receive signals, for example common pilot channel (CPICH) signals, from a plurality of BTSs in anticipation of a soft handoff from a current service BTS to a subsequent serving BTS.

In instances in which the wireless communications device 200 utilizes a plurality of receiving antennas, for example the receiving antennas 222_1 and 222_2, the wireless communications device 200 may utilize receive diversity. In a receive diversity system, the receiver 202 may receive a first set of signals via the receiving antenna 222_1 and a second set of signals via the receiving antenna 222_2. In various embodiments, which may utilize receive diversity, the receiver 202 and/or the two-step search module 210 may also process signals that are transmitted by BTSs, which utilize signal transmission diversity. Hence, some embodiments may support any combination of transmit and receive diversity (i.e., no diversity, receive diversity only, transmit diversity only, or both receive and transmit diversity). In embodiments employing multiple receive antennas 222, the receive diversity adaptation module 211 may be configured to selectively enable or disable receive diversity based, for example, on whether a path from one of the receive antennas 222 is comparatively weaker and may be disabled.

Figure 3:
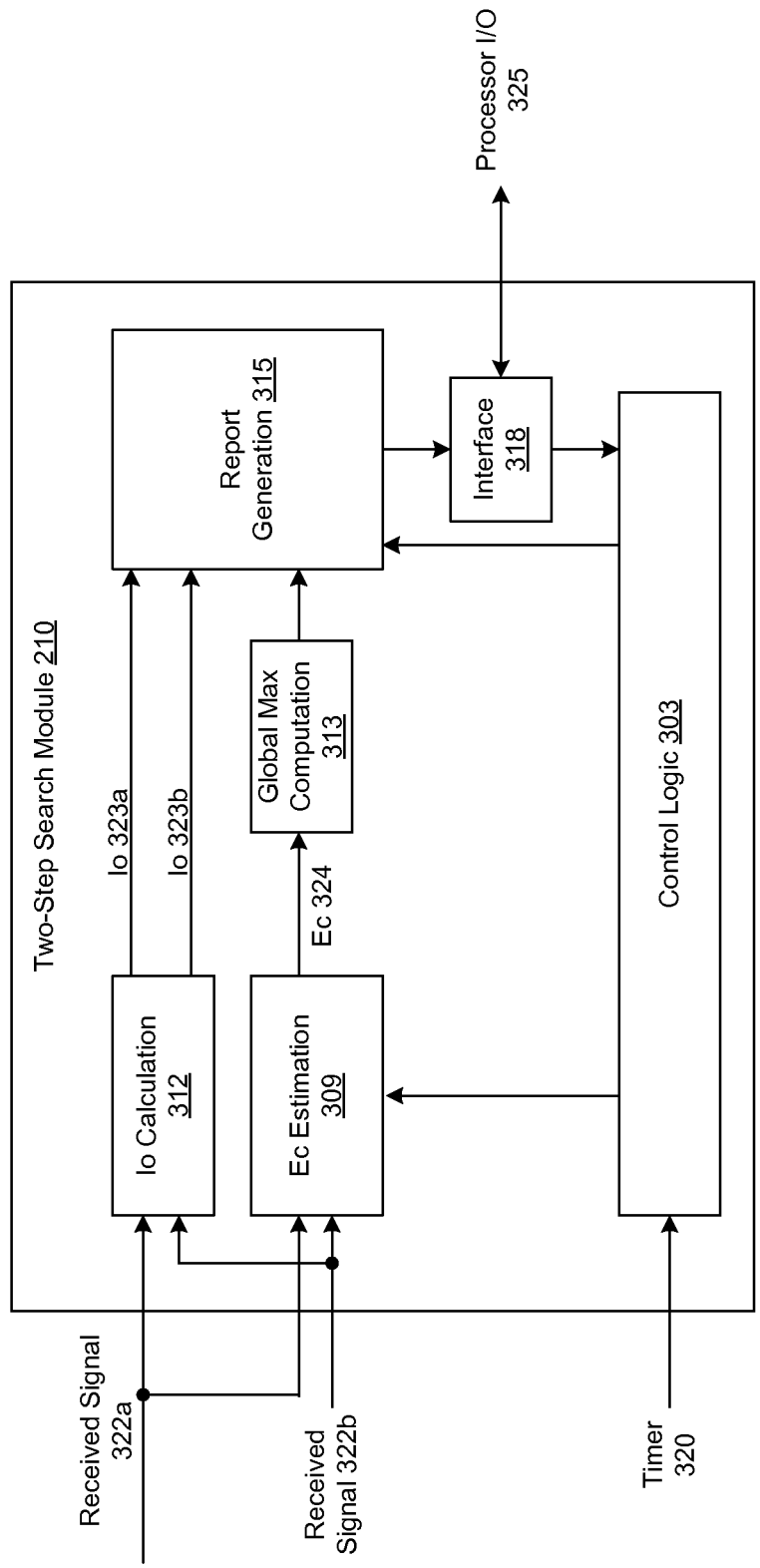
FIG. 3 is a drawing of an exemplary two-step search module employed in the wireless communications device of FIG. 2, in accordance with an embodiment of the present disclosure.

FIG. 3 is a drawing of an exemplary two-step search module 210 employed in the wireless communications device 200 of FIG. 2, in accordance with an embodiment of the present disclosure. The two-step search module 210 may include control logic 303, descramble and accumulate (Ec estimation) logic 309, Io calculation logic 312, global maximum computation logic 313, report generation logic 315, a processor interface 318, and/or other components. The control logic 303 is used to control the report generation logic 315, the Ec estimation logic 309, and/or other components. A timer signal 320 is provided to the control logic 303 from a master timer. For example, the timer signal 320 may include a master time slot index, a master timer sample count, a clock divider signal, and/or other signals.

In one embodiment, the logic related to signal processing operates at M times the chip rate, (e.g., M*3.84 MHz). In one embodiment, the two-step search module 210 uses 240 c×M clock cycles to perform the multiple chip correlations for the 15 frame timing hypotheses for each of 16 scrambling code candidates (15×16=240). Thus, during the time duration of ceiling (240/M chips), all 15 frame timing hypotheses for up to 16 scrambling codes are processed in parallel. The two-step search module 210 processes ceiling (240/M) chips of the received samples per c×M clock cycle. In this way, all 16×15=240 scrambling code and frame timing hypotheses may be searched in parallel within a predefined accumulation period.

The accumulation period is defined by a coherent accumulation length (CI) in chips and a non-coherent accumulation length (NCI). In one embodiment, the CI and NCI may be chosen such that the total accumulation length fits within one time slot (2560 chips). If the maximum number of scrambling code candidates equals 32, then it may take two total accumulation length units (e.g., 2 time slots) to complete the search over 32×15=480 hypotheses. In one embodiment, the search time may also scale linearly depending on whether receive diversity, transmit diversity, or both receive and transmit diversity are enabled.

Continuing the example above, the search for 32 scrambling codes when either transmit or receive diversity is enabled may take 2×2=4 time slots, and the search for 32 scrambling codes when both transmit and receive diversity are enabled may take 2×4=8 time slots. In other embodiments, the design may be modified such that the search time does not increase when diversity is enabled. Such embodiments may employ additional hardware (e.g., to process 2*ceiling(240/M) chips of received samples per c×M clock cycle), an increased clock cycle (i.e., an increased value for M), or a combination of both additional hardware and an increased clock cycle, For example, a clock rate may be doubled when either transmit or receive diversity is enabled or quadrupled when both are enabled.

The received signal 322 from a chip matched filter is provided to the Io calculation logic 312 and to the Ec estimation logic 309. The received signal corresponds to the CPICH channel. The processor interface 318 is coupled to the processor 206 (FIG. 2) by way of a processor I/O signal 325. The processor interface 318 may comprise an advanced peripherals bus (APB) interface or other interface. The processor I/O signal(s) 325 may convey the Io values calculated by the Io calculation logic 312, the energy values associated with the winning scrambling code and frame timing hypothesis, and/or other data to the processor 206.

The Io calculation logic 312 is configured to estimate total energy for each of the received signals 322a and/or 322b. Each of the received signals 322a and 322b corresponds to a received signal from a respective receive antenna 222 (FIG. 2). The outputs, Io 323a and Io 323b, each correspond to a measure of total energy as the "Io" component of an Ec/Io metric. The Io 323a and 323b signals are provided to the report generation logic 315. In one embodiment, each received signal 322 is composed of M-bit I/Q (i.e., M-bit I and M-bit Q) complex samples at a C×P sampling rate (e.g., P×3.84 MHz). Inside the Io estimation logic 312, the real values (I components) are squared, the imaginary values (Q components) are squared, and the squared I and Q are accumulated at a chip by P (c×P) rate.

The total energy Io for a given receive antenna 222 is computed over the same period as that used for the corresponding Ec estimation which will be explained below. That is, for all possible hypotheses, the Io and Ec may be computed over the same time period, defined in chips as the product between the coherent and non-coherent accumulation lengths.

The Ec estimation logic 309 is configured to estimate energy per chip (Ec) for each of the received signals 322a and 322b. The Ec estimation logic produces Ec results 324. The Ec estimation logic 309 will be described in more detail with reference to FIG. 4 below.

Figure 4:
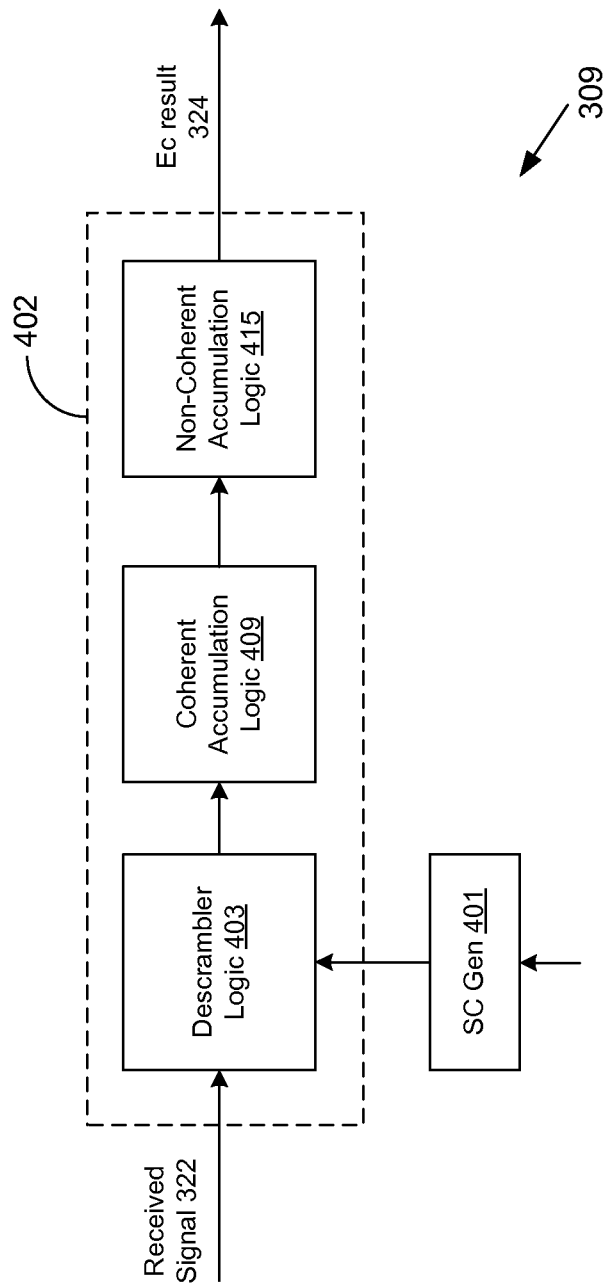
FIG. 4 is a drawing of exemplary Ec estimation logic employed in the two-step search module of FIG. 3, in accordance with an embodiment of the present disclosure.

FIG. 4 is a drawing of exemplary Ec estimation logic 309 employed in the two-step search module 210 of FIG. 3, in accordance with an embodiment of the present disclosure. In FIG. 4, the scrambling code generation logic 401 may be configured to process a sequence of multiple chips simultaneously. In one embodiment, the scrambling code generation logic 401 may be configured to process 8 samples (I and Q pairs) for 8 scrambling code phases per clock cycle. In one embodiment, the scrambling code generation logic 401 may incorporate a shift register where the taps are generated from a look-up table for each frame timing hypothesis.

The received signal 322 may include I and Q samples at a multiple of the chip rate, which may be downsampled to the chip rate. The samples may then be sent to a bank of slices 402, for example, 16×15=240 slices 402. Each slice 402 may contain descrambler logic 403, followed by coherent accumulation logic 409, and non-coherent accumulation logic 415. The starting point of the descrambling and accumulation is synchronized to a given path position. The I and Q samples are descrambled for each scrambling code candidate. The scrambling code phase may be offset by one slot, for example, such that all 15 slices per scrambling code covers all 15 possible slot offsets.

The post-descrambled output is supplied to the coherent accumulation logic 409, which sums CI consecutive samples, or chips. The coherent accumulation logic 309 may include a despreader (e.g., an 8-chip despreader) which is configured to despread multiple chips from a sequence simultaneously per clock cycle. In one embodiment, the next sequence of chips may be staged in advance while the current sequence of chips are being processed by the despreader. The magnitude square of the coherent accumulation is then computed. The magnitude square is then supplied to the non-coherent accumulation logic 415, which sums NCI consecutive samples and outputs an Ec result 324. The total accumulation is over N=NCI×CI samples. As a non-limiting example, if the coherent accumulation length CI is set to 1024 samples and the non-coherent accumulation length NCI is set to 2, the total accumulation time period is 2048 samples.

Referring back to FIG. 3, if the total number of hypotheses equals to 16×15=240, the Ec estimation logic 309 will output 240 Ec results 324 per receive antenna 222 (FIG. 2), at the end of each accumulation time period. The Ec results 324 may be combined across receive antennas 222 before being passed to the global maximum computation logic 313, such that the winning hypothesis is based on the combined result. After N samples have been accumulated, a global maximum is computed over slot offsets and scrambling codes by the global maximum computation logic 313 and passed to the report generation logic 315. The global maximum may be represented, for example, by the maximum accumulated energy (per receive antenna 222 and/or post-receive combining), the code index which produced the maximum energy, and the slot number corresponding to the location of the frame boundary of the winning code for the two-step search. Over the same accumulation time period, the Io calculation logic 312 outputs one Io estimate 323 per receive antenna 222 to the report generation logic 315. The report generation logic 315 then reports the global maximum along with the per-receive-antenna Io estimate to the interface 318.

If the total number of hypotheses equals 32×15=480, the global maximum computation logic 313 computes the maximum over 480 Ec results 324, where 240 Ec results 324 are computed over a first accumulation time period of N samples, and the remaining 240 Ec results 324 are computed over the next accumulation time period of N samples. Accordingly, it may take two consecutive accumulation time periods to determine a winning energy level and corresponding hypothesis. The total accumulation time period may correspond to, or be less than, L slot time periods when the scrambling codes to be searched include L×16 or fewer scrambling codes.

When multiple accumulation time periods are employed, the winning energy level from the previous accumulation time period may be stored and compared with the subsequent Ec results 324 from the current accumulation time period to determine a winning maximum. An Io result 323 may be determined for each accumulation time period. In one embodiment, the report generation logic 315 may be configured to report the Io result 323 that is consistent with the accumulation time period during which the winning maximum is determined where multiple accumulation time periods are employed.

Transmit diversity may be enabled in the Ec estimation logic 309 using the property of the CPICH channel that it is orthogonal over a certain period of chips (e.g., 512 chips). Signals from multiple transmit antennas may be independently measured because they become orthogonal. To this end, the signal from a second transmit antenna may be recovered by rotating the descrambled signal by the polarity of the second transmit antenna. This rotation causes the signal from the first transmit antenna to be canceled out. The Ec results 324 are summed across transmit antennas after the magnitude square of the coherent accumulation is computed per-transmit antenna.

Figure 5A:
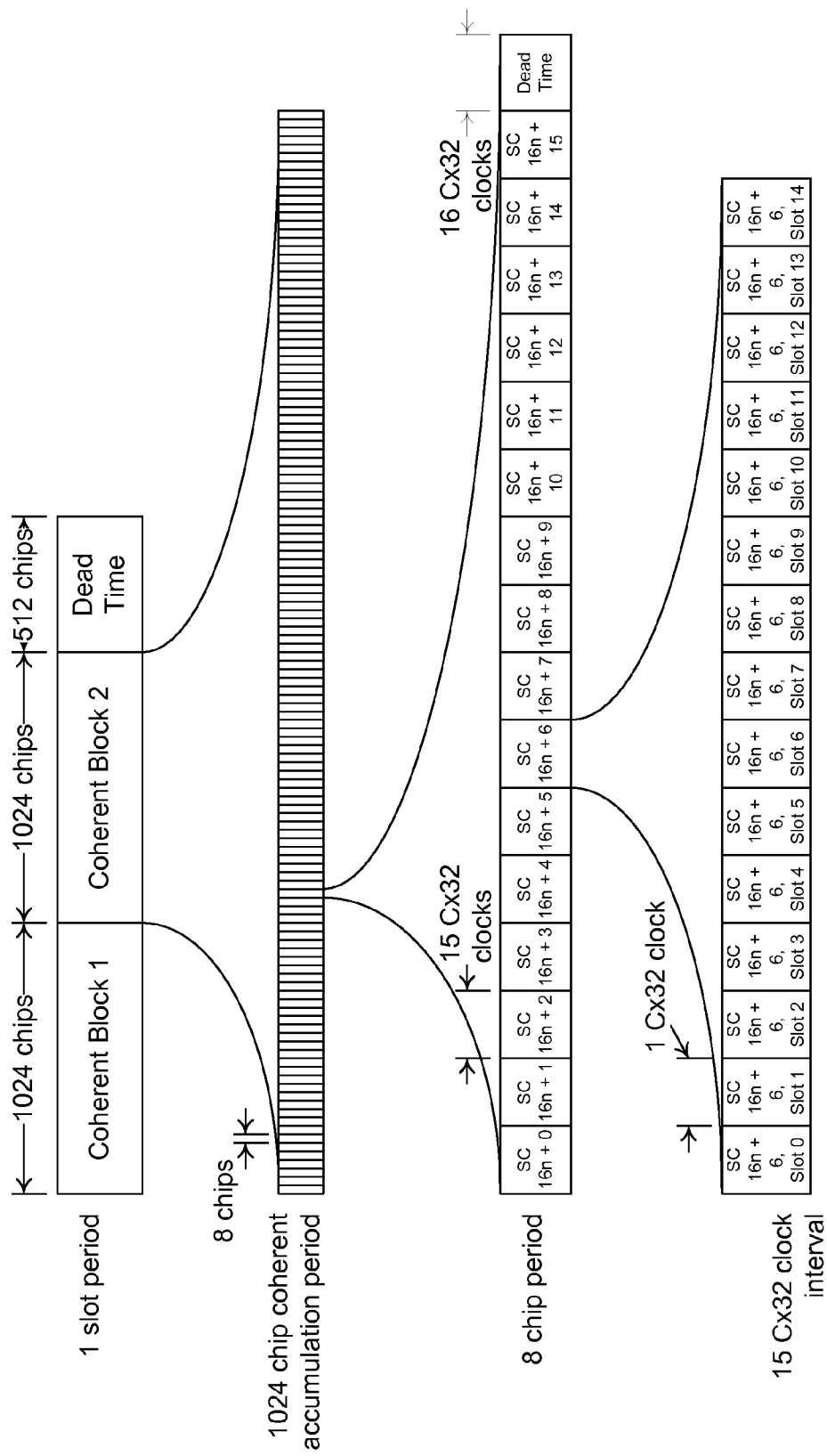
FIGS. 5A and 5B are drawings depicting timelines of per-slot two-step search operations, in accordance with various embodiments of the present disclosure.

Moving now to FIG. 5A, shown is a drawing depicting a timeline of per-slot two-step search operations without transmit or receive diversity according to one embodiment. Each one slot period of 2560 chips is divided, for example, into a coherent block 1 of 1024 chips, a coherent block 2 of 1024 chips and dead time of 512 chips. As shown, a 1024 chip coherent accumulation period is divided into 128 8-chip periods. During an 8-chip period, all 15 slot hypotheses for up to 16 scrambling codes (SC) are processed. One 8-chip despreading operation occurs during each active chip times 32 (C×32) time period.

Figure 5B:
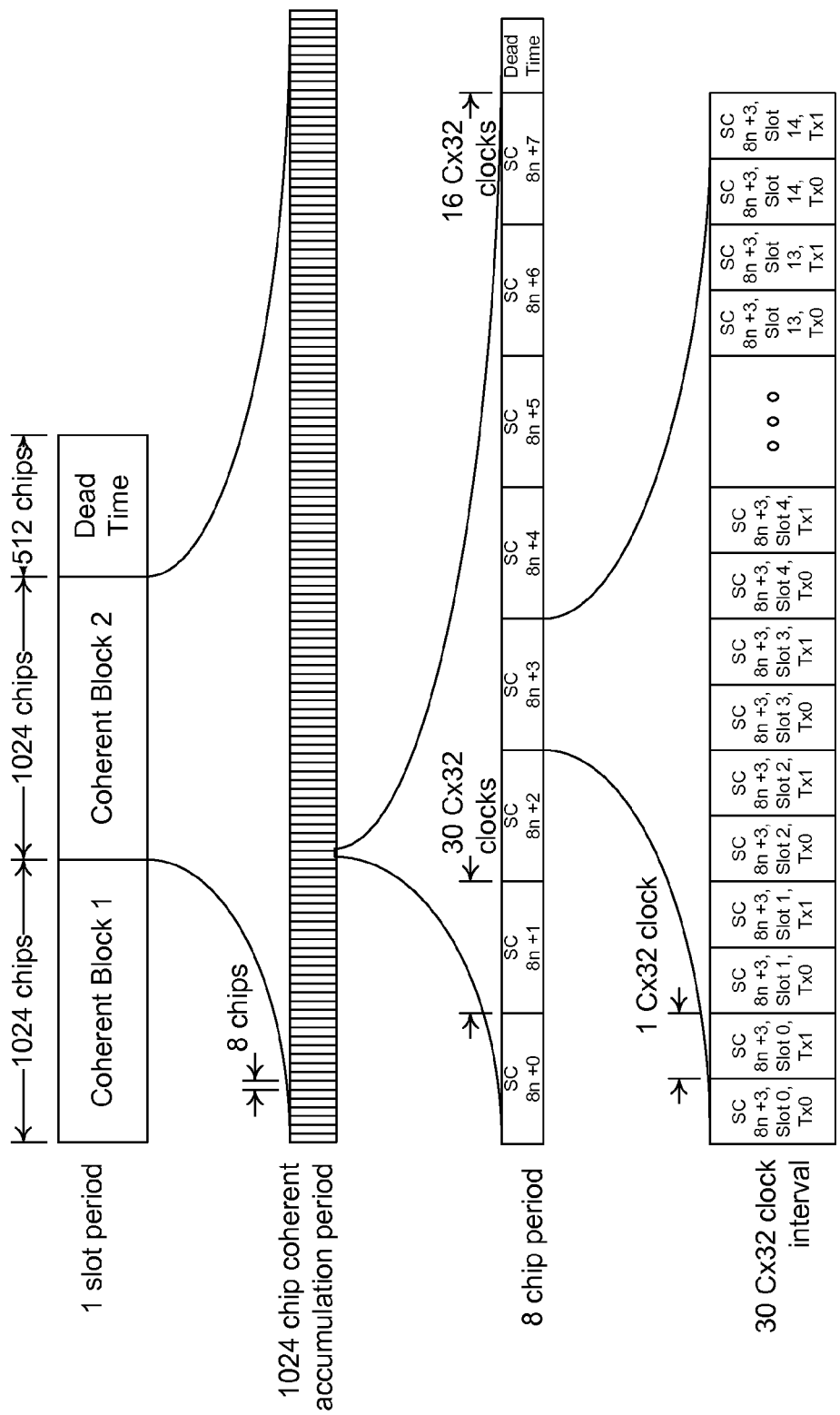

With reference to FIG. 5B, shown is a drawing depicting a timeline of per-slot two-step search operations with either transmit or receive diversity according to one embodiment. Each one slot period of 2560 chips is divided, for example, into a coherent block 1 of 1024 chips, a coherent block 2 of 1024 chips and dead time of 512 chips. As shown, a 1024 chip coherent accumulation period is divided into 128 8-chip periods. During an 8-chip period, all 15 slot hypotheses for up to 8 scrambling codes (SC) are processed. One 8-chip despreading operation occurs during each active chip times 32 (C×32) time period. In other words, the time for performing the two-step search has increased by a factor of two relative to the timeline of FIG. 5A (8 scrambling codes per period versus 16 scrambling codes per period). Where both transmit diversity and receive diversity are employed, the time for performing the two-step search is increased by a factor of four relative to the timeline of FIG. 5A (4 scrambling codes per period versus 16 scrambling codes per period).

Figure 6:
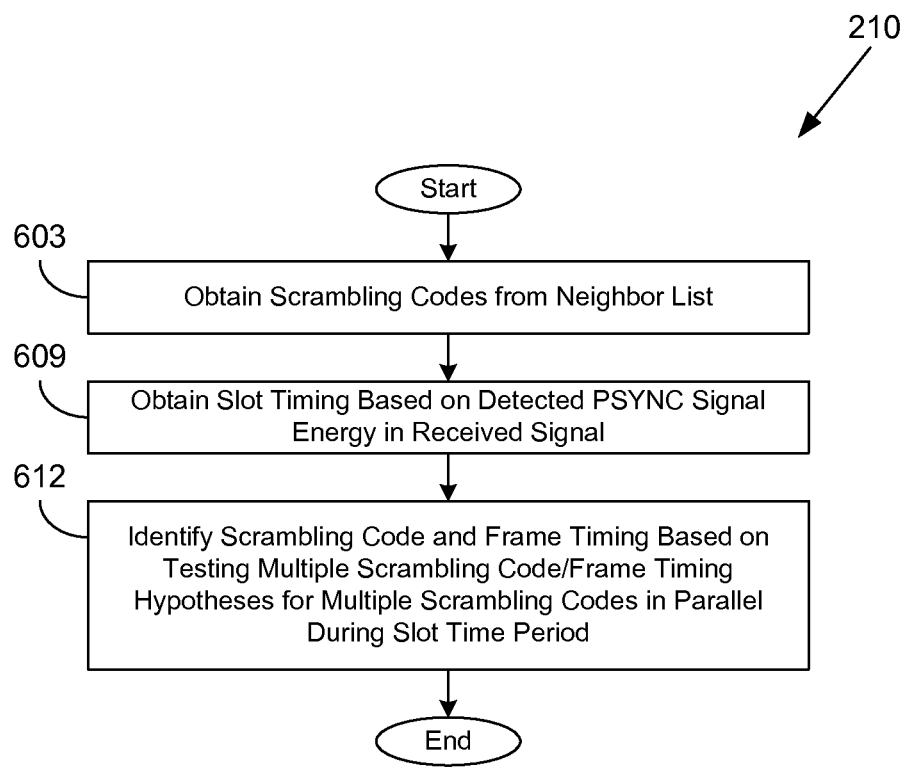
FIG. 6 is a flowchart illustrating one example of functionality implemented as portions of the two-step search module of FIG. 3 according to various embodiments of the present disclosure.

With reference to FIG. 6, shown is a flowchart that provides one example of the operation of a portion of the two-step search module 210 (FIG. 2) according to various embodiments. It is understood that the flowchart of FIG. 6 provides merely an example of the many different types of functional arrangements that may be employed to implement the operation of the portion of the two-step search module 210 as described herein. As an alternative, the flowchart of FIG. 6 may be viewed as depicting an example of steps of a method implemented in the wireless communications device 200 (FIG. 2) according to one or more embodiments.

Beginning with box 603, the two-step search module 210 obtains scrambling codes from a neighbor list 240 (FIG. 2). In box 609, the two-step search module 210 obtains a slot timing based at least in part on a detected PSYNC peak energy in a received signal. In box 612, the two-step search module 210 identifies the scrambling code and the frame timing for the received signal based at least in part on testing multiple scrambling code/frame timing hypotheses for multiple scrambling codes from the neighbor list 240 in parallel during an accumulation time period.

In one example, the scrambling code and frame timing are identified after one slot time period. In another example, the scrambling code and frame timing are identified after two slot time periods. In another example, where receive or transmit diversity are used, the scrambling code and frame timing are identified after four slot time periods. In yet another example, where both receive and transmit diversity are used, the scrambling code and frame timing are identified after eight slot time periods. In other embodiments, the accumulation time period may not increase when receive and/or transmit diversity are employed.

If embodied in dedicated hardware, the systems described herein can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein. Although the various systems described herein may be embodied in dedicated hardware as discussed above, as an alternative the same may also be embodied in software or code executed by general purpose hardware or a combination of software/general purpose hardware and dedicated hardware.

The flowchart of FIG. 6 shows the functionality and operation of an implementation of portions of the two-step search module 210. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 206 (FIG. 2) in a computer system or other system. The machine code may be converted from the source code, etc. If embodied in hardware, each block may represent a circuit or a number of interconnected circuits to implement the specified logical function(s).

Although the flowchart of FIG. 6 shows a specific order of execution, it is understood that the order of execution may differ from that which is depicted. For example, the order of execution of two or more blocks may be scrambled relative to the order shown. Also, two or more blocks shown in succession in FIG. 6 may be executed concurrently or with partial concurrence. Further, in some embodiments, one or more of the blocks shown in FIG. 6 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein that comprises software or code can be embodied in any non-transitory computer-readable medium for use by or in connection with an instruction execution system such as, for example, a processor 206 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, at least the following is claimed:

1. A wireless communications device comprising:
at least one processor and a memory, wherein the at least one processor accesses the memory to perform operations comprising:
obtaining scrambling codes associated with a plurality of neighboring cells;
obtaining slot timing for a signal received from one of the plurality of neighboring cells based at least in part on a detection of primary synchronization peak energy in the received signal;
testing, in response to obtaining the slot timing, frame timing hypotheses and at least two of the scrambling codes in parallel during an accumulation time period of the received signal, wherein each of the frame timing hypotheses indicates one of a plurality of slot positions in a frame; and
identifying one of the frame timing hypotheses and one of the at least two scrambling codes for decoding the received signal, the one of the frame timing hypotheses and the one of the at least two scrambling codes having resulted in a global maximum accumulated energy value during the testing.

2. The wireless communications device of claim 1, wherein the received signal corresponds to a wideband code division multiple access (WCDMA) signal.

3. The wireless communications device of claim 1, wherein the operations further comprise identifying the one of the scrambling codes during a discontinuous reception (DRX) cycle.

4. The wireless communications device of claim 1, wherein the plurality of neighboring cells belong to a monitored set of cells that is distinct from an active set of cells.

5. The wireless communications device of claim 1, wherein the accumulation time period increases when one of transmit diversity or receive diversity is employed and a clock rate is held constant.

6. The wireless communications device system of claim 5, wherein the operations further comprise identifying an identifier for the one of the scrambling codes, and an identifier for the frame timing that resulted in the global maximum accumulated energy value.

7. The wireless communications device of claim 6, wherein the operations further comprise reporting a total accumulated energy value corresponding to a time period within the accumulation time period, the time period being associated with the maximum accumulated energy value.

8. The wireless communications device of claim 5, wherein the operations further comprise simultaneously providing a sequence of a plurality of scrambling code phases corresponding to a selected one of the frame timing hypotheses and a selected one of the at least two of the scrambling codes.

9. The wireless communications device of claim 8, wherein at least 8 scrambling code phases are simultaneously provided.

10. The wireless communications device of claim 5, wherein the plurality of slot positions in the frame comprises 15 slot positions in the frame.

11. The wireless communications device of claim 1, wherein the accumulation time period is less than L slot time periods when the scrambling codes include fewer than L×16 scrambling codes.

12. A method for cell discovery in a wireless communications device, comprising:
obtaining scrambling codes associated with a plurality of neighboring cells;
obtaining slot timing for a received signal based at least in part on a detection of primary synchronization peak energy in the received signal;
testing, in response to obtaining the slot timing, frame timing hypotheses and at least two of the scrambling codes in parallel during an accumulation time period of the received signal to determine an accumulated energy value associated with each of the frame timing hypotheses in combination with each of the at least two scrambling codes, wherein each of the frame timing hypotheses indicates one of a plurality of slot positions in a frame; and
identifying, by a processor, one of the frame timing hypotheses and one of the at least two scrambling codes for decoding the received signal based at least in part on the testing of the frame timing hypotheses and the at least two of the scrambling codes in parallel, the identified one of the frame timing hypotheses and the one of the at least two scrambling codes being associated with a global maximum accumulated energy value.

13. The method of claim 12, wherein the received signal corresponds to a wideband code division multiple access (WCDMA) signal.

14. The method of claim 13, wherein each of the frame timing hypotheses indicates one of a plurality of slot positions in a frame.

15. The method of claim 13, wherein the identifying further comprises simultaneously providing a sequence of a plurality of scrambling code phases corresponding to a selected one of the at least two of the scrambling codes and a selected one of the frame timing hypotheses.

16. The method of claim 15, wherein at least 8 scrambling code phases are simultaneously provided.

17. The method of claim 12, wherein the accumulation time period is less than two slot time periods.

18. The method of claim 12, wherein the accumulation time period increases when one of transmit diversity or receive diversity is employed and a clock rate is held constant.

19. The method of claim 12, wherein a clock rate increases when one of transmit diversity or receive diversity is employed and the accumulation time period is held constant.

20. A computer program product comprising instructions stored in a non-transitory computer-readable storage medium, the instructions comprising:
   instructions for obtaining scrambling codes associated with neighboring cells;
   instructions for obtaining slot timing for a received signal based at least in part on a detection of primary synchronization peak energy in the received signal;
   instructions for testing frame timing hypotheses and at least two of the scrambling codes in parallel during an accumulation time period of the received signal, wherein each of the frame timing hypotheses indicates one of a plurality of slot positions in a frame; and
   instructions for identifying, by a processor, one of the frame timing hypotheses and one of the scrambling codes for decoding the received signal, the testing of the one of the frame timing hypotheses and the one of the scrambling codes having resulted in a global maximum accumulated energy value.

\* \* \* \* \*